United States Patent [19]
O'Brien

[11] 3,993,513
[45] Nov. 23, 1976

[54] COMBINED METHOD FOR FABRICATING OXIDE-ISOLATED VERTICAL BIPOLAR TRANSISTORS AND COMPLEMENTARY OXIDE-ISOLATED LATERAL BIPOLAR TRANSISTORS AND THE RESULTING STRUCTURES

[75] Inventor: David O'Brien, Mountain View, Calif.

[73] Assignee: Fairchild Camera and Instrument Corporation, Mountain View, Calif.

[22] Filed: May 16, 1975

[21] Appl. No.: 578,060

Related U.S. Application Data

[62] Division of Ser. No. 518,445, Oct. 29, 1974, Pat. No. 3,962,717.

[52] U.S. Cl. ................................ 148/175; 29/577; 29/578; 148/187; 357/35; 357/44; 357/46; 357/50
[51] Int. Cl.² ................. H01L 21/76; H01L 21/20
[58] Field of Search ............. 148/175, 187; 29/577, 29/578; 357/35, 44, 46, 49, 50

[56] References Cited
UNITED STATES PATENTS

| | | | |
|---|---|---|---|
| 3,648,125 | 3/1972 | Peltzer | 357/49 |
| 3,873,383 | 3/1975 | Kooi | 148/187 |
| 3,873,989 | 3/1975 | Schinella et al. | 357/50 X |
| 3,904,450 | 9/1975 | Evans et al. | 148/175 |
| 3,911,471 | 10/1975 | Kooi et al. | 357/50 |

OTHER PUBLICATIONS

Berger et al, "Merged–Transistor Logic–Concept" IEEE J. Solid State Circuits, vol. SC-7, No. 5, Oct. 1972, pp. 340–346.
Wiedmann, S., "Injection–Coupled Memory–." IBID, vol. SC–8, No. 5, Oct. 1973, pp. 332–337.
Cosand, A., "Very High Speed Low Power–Circuit Process" IEEE Electron Devices Mtg, Wash. D.C., 1973, pp. 35–37.

Primary Examiner—L. Dewayne Rutledge
Assistant Examiner—W. G. Saba
Attorney, Agent, or Firm—Alan H. MacPherson; Henry K. Woodward; J. Ronald Richbourg

[57] ABSTRACT

A process for fabricating oxide-isolated vertical bipolar transistors and complementary oxide-isolated lateral bipolar transistors incorporates the steps of growing a doped epitaxial layer of single-crystal silicon on a silicon substrate, applying a first insulation material in a selected pattern over the epitaxial layer to define oxide-isolation regions and device regions, etching grooves in the areas in which oxide-isolation regions will be formed, applying a self-aligned base insulation material over those portions of the interface between the first insulation material and the grooves which bound the region between the base of any vertical bipolar transistor to be formed and the emitter of any lateral bipolar transistor to be formed, applying an impurity of a conductivity type opposite to the conductivity type of the epitaxial layer to those groove areas not covered by the self-aligned base insulation material, the impurity serving to prevent emitter-to-collector inversion along the wall of the base of any vertical bipolar transistor without shorting the emitter and collector of any lateral bipolar transistor, forming oxide-isolation regions in the grooves and forming the vertical bipolar transistors and the lateral bipolar transistors in the device regions. The process of the present invention will produce discrete lateral bipolar transistors, discrete vertical bipolar transistors capable of operation in the conventional mode or in the inverse mode, or a composite structure which merges both a vertical bipolar transistor and a lateral bipolar transistor together on the same silicon island to form an injection-logic gate in which the base of the vertical bipolar transistor serves as the collector of the lateral bipolar transistor, the vertical transistor being operated in the inverse mode.

8 Claims, 21 Drawing Figures

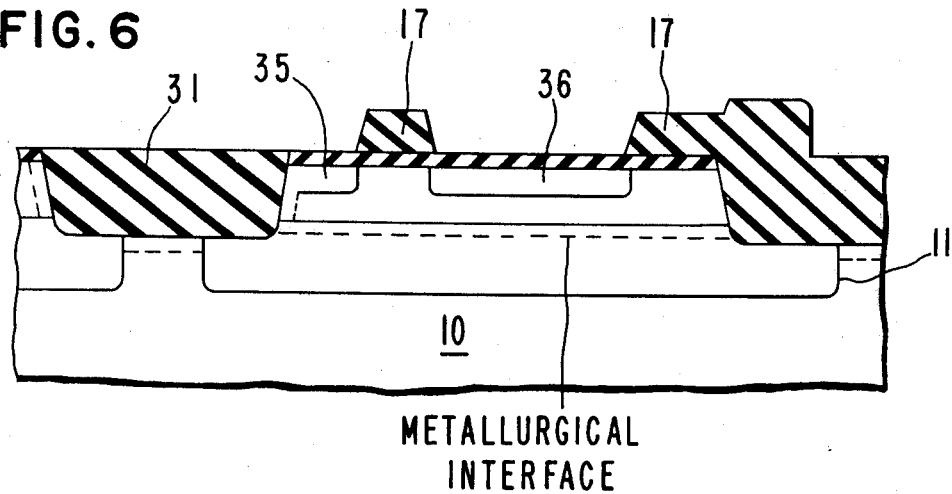
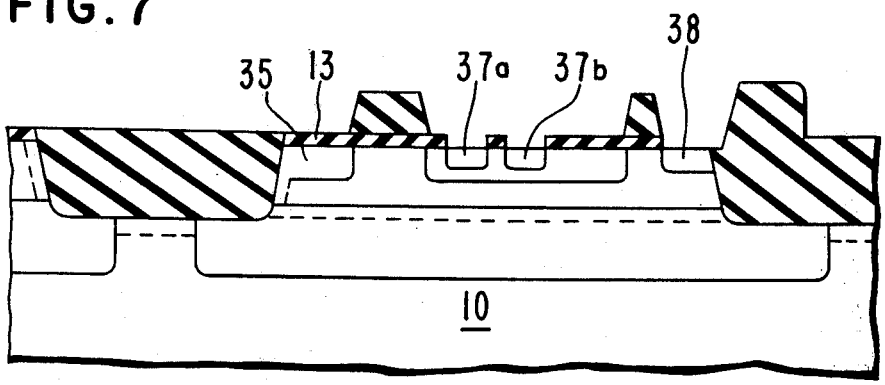
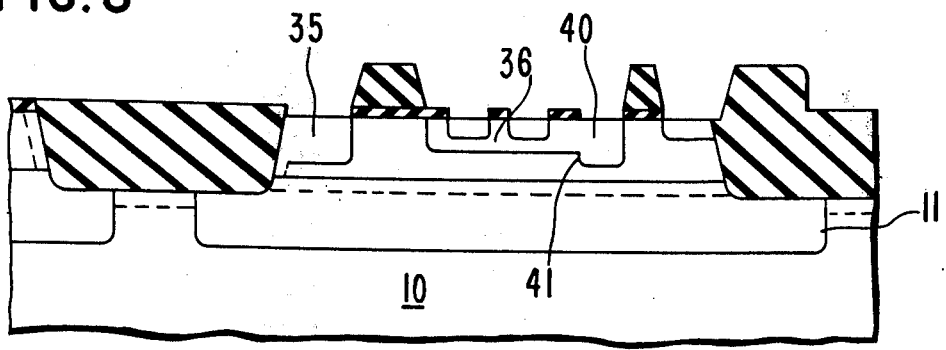

COMBINED METHOD FOR FABRICATING OXIDE-ISOLATED VERTICAL BIPOLAR TRANSISTORS AND COMPLEMENTARY OXIDE-ISOLATED LATERAL BIPOLAR TRANSISTORS AND THE RESULTING STRUCTURES

This is a division of application Ser. No. 518,445 filed Oct. 29, 1974, now U.S. Pat. No. 3,962,717.

BACKGROUND OF THE INVENTION

This invention relates to a process for fabricating oxideisolated vertical bipolar transistors, complementary oxide-isolated lateral bipolar transistors, or composite bipolar transistors merging both a vertical and a lateral bipolar transistor and the resulting structures. In particular, the process and structures of the present invention relate to oxide-isolated vertical bipolar transistors, complementary lateral bipolar transistors or merged bipolar transistors whose operating characteristics may be optimized.

As a general objective it is desirable to be able to produce both vertical bipolar transistors and complementary lateral bipolar transistors using the same process steps. Vertical bipolar transistors, particularly vertical NPN's, are the most widely used device in bipolar integrated circuit design. The electron mobility in NPN's is greater than the hole mobility in PNP's. In such vertical bipolar transistors the base width can be accurately controlled and can be made as small as 0.1 micron by thermal diffusion or ion-implantation techniques. Thus, high device gain, B, can be achieved over a wide range of currents in small areas using controlled processing. When vertical bipolar transistors are used in the inverted mode, they are useful for common emitter/multi-collector structures which are frequently used in logic functions. Such structures can be realized by using a common buried layer as the emitter with separated collectors being formed in the surface of the epitaxial layer. This concept is disclosed in U.S. Pat. No. 3,244,950 issued to J. P. Ferguson. Lateral bipolar transistors, such as lateral PNP's, are highly useful for such applications as level shifters, active loads and current mirrors. See R. J. Widler, *Journal of SolidState Circuits*, Vol. SC-4, No. 4, August 1969. While it is within the state of the art to produce vertical bipolar transistors and complementary lateral bipolar transistors on the same chip, typically such joint fabrication requires that additional sequences of process steps be utilized in order to provide optimal versions of the two types of devices. It would be desirable, then, to be able to produce vertical bipolar transistors, i.e., vertical NPN's, and complementary lateral bipolar transistors, i.e., lateral PNP's, using the same process steps so that both types of devices can be incorporated on the same chip without additional process steps which usually lower yield and increase cost.

A new type of logic called integrated injection logic (also called merged transistor logic) has been proposed. It is a radically different but remarkably simple form of bipolar logic. Integrated injection logic (commonly abbreviated I²L) reduces a gate to a complementary transistor pair. This complementary transistor pair may be integrated into a single device if the lateral device, e.g., lateral PNP, is used as the current source for the base of the vertical device, e.g., a vertical NPN, which is operating in an inverse mode. See *Electronics*, Feb. 21, 1974, pp. 92–95. See also Hart et al, "Bipolar LSI Takes New Direction with I²L", *Electronics*, Oct. 3, 1974, pp. 111. The origin of this concept is found in two papers delivered to the IEEE International Solid-State Circuits Conference in February 1972. See H. H. Berger and S. K. Wiedman, "Merged Transistor Logic – a low-cost bipolar logic", Digest, 1972 ISSCC, pp. 90–91, *Journal of Solid-State Circuits*, Vol. 7, No. 5, October 1972, pp. 304–346, and C. J. Hart and A. Slob, "Integrated injection Logic – A New Approach to LSI", Digest, 1972 ISSCC, pp 92–93, *Journal of Solid-State Circuits*, October 1972, Vol. 7, No. 5, pp. 346–351. As described in these articles, integrated injection logic possesses the inherent advantage of being able to reduce the size of circuit elements since gates are reduced to a single device format, possesses an inherently low propagation-delay power product as a result of low operating voltage and capacitance, and can generally be fabricated with as few as five masks. Using an additional masking step to form a buried layer associated with each silicon island, logic families such as T²L, ECL and DTL may be fabricated on the same chip. Since each gate, as stated above, is comprised of a complementary transistor pair, it is desirable to be able to fabricate complementary transistor pairs, e.g., a vertical bipolar NPN and a complementary lateral PNP, using the same process steps and, since the complementary transistor pair may be integrated into the same device, it is especially desirable to be able to make a composite structure which incorporates a vertical bipolar transistor and a complementary lateral bipolar transistor.

Oxide-isolated devices are known to provide significant advantages over junction-isolated or cut-and-fill-isolated devices. The employment of Isoplanar oxide-isolation, as disclosed in U.S. Pat. No. 3,648,125 issued to Peltzer, particulaly in the walled emitter format (see W. D. Baker et al, "Oxide Isolation Brings High Density to Production Bipolar Memories", *Electronics*, March 29, 1973, pp. 67), accomplishes the objective of inter-device isolation, achieves high packing densities, reduces sidewall capacitances and reduces direct current losses for vertical bipolar devices. It would clearly be desirable, then, to be able to fabricate the merged complementary transistor pair described above utilizing oxide isolation. However, even though vertical bipolar transistors fabricated in the preferred walled emitter format have a considerably improved inverse gain, it is found that inversion of the base occurs between the emitter and collector along the oxide wall. This inversion occurs because charges in the oxide induce charges of opposite polarity at the silicon surface. For example, the charges due to $Q_{ss}$ and sodium ions are positive and induce a negative charge at the silicon surface. See Bruce E. Deal, "The Current Understanding of Charges in the Thermally Oxidized Silicon Structure", *Journal of Electrochemical Society*, Vol. 121, No. 6, June 1974, pp. 198C. In the case of a p-type silicon region, the presence of these charges depletes the p-type concentration and can invert the surface of the region to n-type. In addition, the p-type silicon is normally doped with boron which, during the oxidation process, preferentially segregates into the oxide and results in a lower concentration of boron at the surface than in the bulk silicon. To prevent this inversion, additional impurities of the same conductivity type as the base are introduced to the oxide wall adjacent the boundary with the base (see U.S. Pat. No. 3,648,125 issued to Peltzer; W. J. Evans et al, "Oxide-Isolated Monolithic Technology and Applications", *Journal of Solid-State Circuits*, Vol. SC-8, No. 5, October 1973, pp. 373–379); these impurities are sometimes called field implants because they are implanted in the field oxide regions and are sometimes called guard rings because they guard the periphery of active regions from inversion. If the alternative of a more heavily doped base region is used, the beta of the vertical bipolar transistor is severely reduced because the beta (ratio of collector current to base current) is inversely related to the base impurity concentration; the result is that the use of a heavily doped base reduces the beta below normally acceptable values. The use of a p-type impurity in the oxide wall adjacent the boundary with the base, as stated above, can alleviate this problem, but since the base of the vertical bipolar transistor is also the collector of the lateral bipolar transistor and has the same conductivity type as the emitter of the complementary lateral bipolar transistor, the guard ring in the oxide wall tends to allow conduction between the emitter and collector of the lateral bipolar device, i.e., the solution to the inversion problem for the vertical bipolar transistor creates a new inversion problem for the lateral bipolar transistor, if one postulates a structure merging a lateral bipolar transistor and a complementary vertical bipolar transistor into a composite injection-logic gate.

BRIEF DESCRIPTION OF THE DRAWINGS

For a more complete understanding of the process of the present invention for fabricating oxide-isolated vertical bipolar transistors, oxide-isolated lateral bipolar transistors and merged injection-logic structures and for a more complete understanding of the structures of the present invention, reference may be had to the accompanying drawings where are incorporated herein and in which:

FIG. 6 is a further view of the cross-section of FIG. 5A after formation of the vertical transistor base/lateral transistor collector and the lateral transistor emitter/injector;

FIG. 7 is a further view of the cross-section of FIG. 6 after formation of the vertical transistor emitters/inverse collectors and formation of the vertical transistor inverse emitter contact;

FIG. 8 is a further view of FIG. 7 after formation of the base contct for the vertical transistor and the resultant increase in concentration of the impurity in the injector region;

SUMMARY OF THE INVENTION

Figure 1:
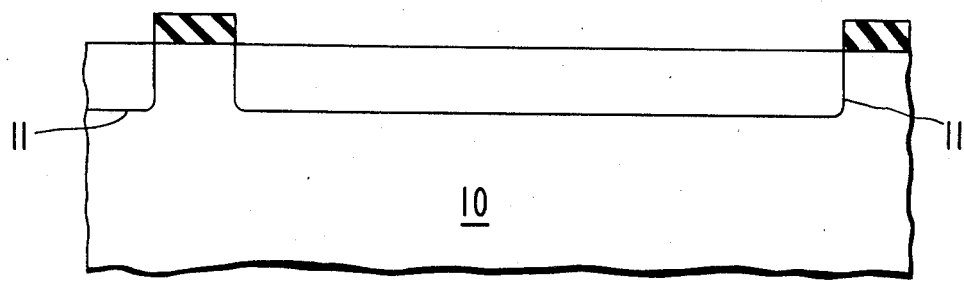
FIG. 1 is a cross-sectional view of a semiconductor substrate having buried layer regions formed in the surface thereof.

A process for fabricating a family of oxide-isolated semiconductor devices in a semiconductor substrate comprises the steps of growing a doped epitaxial layer on the substrate, the epitaxial layer having a conductivity type opposite to the conductivity type of the substrate, forming a groove in the epitaxial layer to surround and define a device region, selectively applying an impurity to the groove to selectively form a guard ring, the impurity having a conductivity type opposite to the conductivity type of the epitaxial layer, forming oxide-isolation regions in the grooves and forming at least one semiconductor device in the device region. In a preferred embodiment in which vertical bipolar transistors and complementary lateral bipolar transistors are merged into an injection-logic gate, the step of forming a groove is accomplished by the step of applying a first insulation material in a selected pattern over the epitaxial layer to define oxide-isolation regions and device regions and by etching those areas in which oxide-isolation regions will be formed and the step of selectively applying an impurity to the grooves is accomplished by applying a self-aligned base insulation material over those portions of the interface between the first insulation material and the grooves which bound the region between the base of any vertical bipolar transistor to be formed and the emitter of any lateral bipolar transistor to be formed and by applying the impurity.

The oxide-isolated structure of the present invention comprises a semiconductor substrate, an epitaxial layer overlaying said substrate and having a conductivity type opposite to that of the substrate, an oxideisolation region which surrounds and defines a device region, the device region having a guard ring selectively formed at the interface of the oxide-isolation region and the device region and at least one semiconductor device formed in the device region. The semiconductor device may be a discrete vertical bipolar transistor capable of operation in the conventional or in the inverse mode, a discrete lateral bipolar transistor or a composite structure in which a vertical bipolar transistor and a lateral bipolar transistor are merged together on the same silicon island to form an injection-logic gate so that the base of the vertical bipolar transistor serves as the collector of the lateral bipolar transistor, the vertical transistor being operated in the inverse mode.

DESCRIPTION OF THE PREFERRED EMBODIMENTS

The concept of injection logic offers the prospect of powerful bipolar devices which can compete with metal-oxide-semiconductor devices on the basis of price per function, while retaining the speed advantage inherent to bipolar. The attainment of high density and a competitive price per function may only be completely realized, however, by employing oxideisolated structures. With injection logic generally the merged nature of the devices, e.g., the combination of a vertical bipolar transistor and a lateral bipolar transistor with shared regions, introduces severe interdependencies between the operating parameters of the constituent devices. With the employment of the oxide-isolation walled emitter format, this difficulty may be compounded by the need to prevent emitter-to-collector inversion along the wall of the vertical, e.g., NPN, transistor.

In an injection-logic cell the $\alpha$ (ratio of collector current to emitter current) of the lateral injector device, e.g., the $\alpha$ of the lateral PNP, will determine overall efficiency. With an $\alpha$ of 0.5, fifty percent of the current reaches the bae of the NPN and is useful current. In the case of large scale integration where several thousand injectors may be used, a high value of $\alpha$ is obviously desirable to minimize power dissipation. However, increasing $\alpha$ (and hence $\beta$, the ratio of collector current to base current) of the injecting PNP device will result in an increase in the reverse $\alpha$ and the revese $\beta$ of the PNP device. Consequently, current due to reverse injection from the NPN base will tend to lower the $\beta$ of the inversely operated NPN. This interdependence of operating parameters of the constituent devices is thus inherently a critical feature of injection-logic devices.

Figure 12:
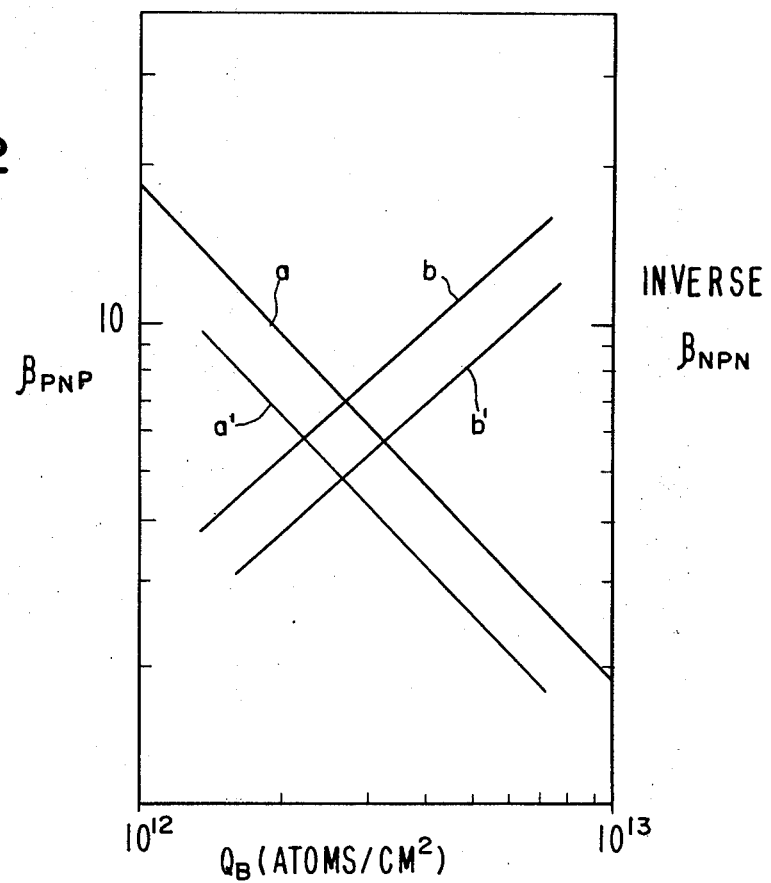
FIG. 12 is a graph showing the qualitative interdependence of the $\beta$ of the vertical transistor in the inverse mode (inverse $\beta$ NPN) and the $\beta$ of the complementary lateral transistor ($\beta$ PNP) in the oxide-isolated merged injection-logic gate structure of the present invention.

For an injection-logic cell to function, the constituent vertical bipolar transistor operating in inverse mode must have a $\beta > 1$. It is desirable to have a vertical transistor with an inverse $\beta$ which is significantly greater than 1 since a faster switching time will be achieved. FIG. 12 shows qualitatively the interdependence of the lateral PNP $\beta$ (the $a$ and $a'$ curves) and the vertical NPN inverse $\beta$ (the $b$ and $b'$ curves) for an oxide-isolated walled emitter injection-logic structure as the integrated impurity concentration in the base of the lateral PNP is varied.

$$(Q_B = \int_0^w {}_0 N_x dx$$

where $w$ = base width and $N_x$ = impurities/volume in lateral PNP base). It can be seen from the $a$ curves that for low impurity concentrations in the lateral PNP base the lateral PNP has a high $\beta$ and from the $b$ curves that the vertical NPN has low values of inverse $\beta$. The shift from the $a'$ to the $a$ curve is obtained by increasing the $p$ doping in the injector of the lateral PNP; the shift from the $b'$ to the $b$ curve is obtained by increasing the $p$ doping in the base contact of the vertical NPN. It can be seen that while the interdependence of the device parameters still exists for the $a$ and $b$ curves, higher values of $\beta$ can be achieved on both devices due to the reduction in recombination current at the contact areas if the optimal $p$ doping is carried out.

The process of the present invention, described in detail below, permits the optimization of both constituents of the merged injection-logic structure and as well optimization of discrete vertical transistors, e.g., vertical NPN's and lateral discrete transistors, e.g., lateral PNP's. This joint optimization is accomplished by utilizing a low concentration of p-type impurities in the base of the vertical NPN transistor, with inversion along the base wall being prevented by a guard ring in the adjacent oxide walls. Shorting of the emitter to collector in the lateral PNP is prevented by a self-aligned base mask which permits the guard ring to be excluded from the base wall of the lateral PNP. Additionally, the implantation of p-type impurities in the emitter of the lateral transistor, e.g. lateral PNP, prior to application of the metallization layer, allows the $\beta$ of the lateral PNP to be optimized by minimizing the recombination current at the emitter contact. And, further, the additional implantation of p-type impurities in the base contact region of the NPN minimizes the recombination current at the base contact to improve the inverse NPN $\beta$.

Figure 2:
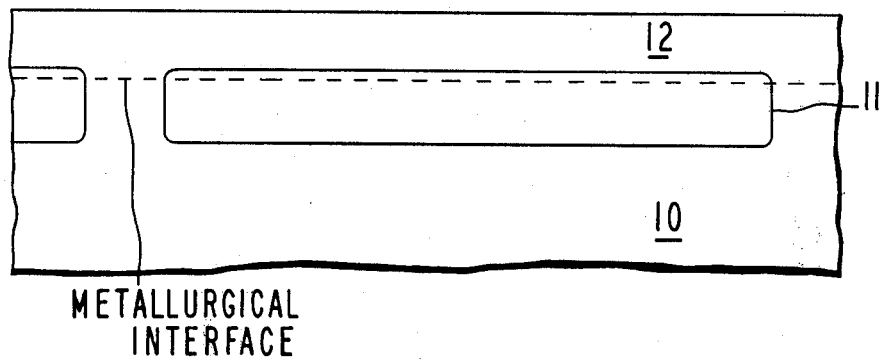
FIG. 2 is a further cross-sectional view of FIG. 1 after growth of a doped epitaxial semiconductor layer.

The fabrication of oxide-isolated injection-logic merged structures in accordance with a preferred embodiment of the present invention begins with the formation of buried layers 11 in a semiconductor substrate 10 as shown in FIG. 1. As described above and in the cited references, this merged structure will ultimately comprise an injection-logic gate having a vertical NPN and a lateral PNP in which the base of the vertical NPN is also the collector of the lateral PNP. The buried layer permits the inverse emitter of the vertical bipolar device to be isolated from devices on other silicon islands on the same chip; if a common emitter is acceptable, such as with a chip containing only injection-logic devices, then this step may be omitted and the epitaxial layer, described below, may serve as the common inverse emitter for all devices. A suitable substrate would be a p-type single-crystal silicon material of (111) orientation with a concentration of p-type impurities in the range of $4 \times 10^{14}$ to $5 \times 10^{15}$ atoms/cm$^2$. Buried layer regions 11 may be formed by a standard photomasking step along with diffusion or implantation techniques and constitutes an n-type region with an impurity concentration between $1 \times 10^{19}$ and $1 \times 10^{20}$ atoms/cm$^2$ with the higher concentration being preferred. As used above and throughout this specification, the phrase "photomasking step" refers to the well-known sequence of applying a uniform layer of a photoresist polymer, selectively exposing the photoresist by radiation of an appropriate wavelength and developing the photoresist to leave a desired pattern, thereby allowing an active step such as diffusion to be performed. Then, typically, the photoresist is removed. The details of each individual masking step are not shown in the drawings and should be inferred from the use of the phrase "photomasking step". Next, an epitaxial layer 12, for example a layer of n-type single-crystal silicon, having an impurity concentration of $10^{16}$ n-type impurity atoms/cm$^2$ and a thickness of 1.2 microns, is applied over the substrate and buried layers. As shown by the dotted line in FIG. 2, the impurities in the buried layer will diffuse upwardly into the epitaxial layer so that the metallurgical interface between the substrate and epitaxial layer is slightly below the effective upper boundary of the buried layer.

Figure 3:
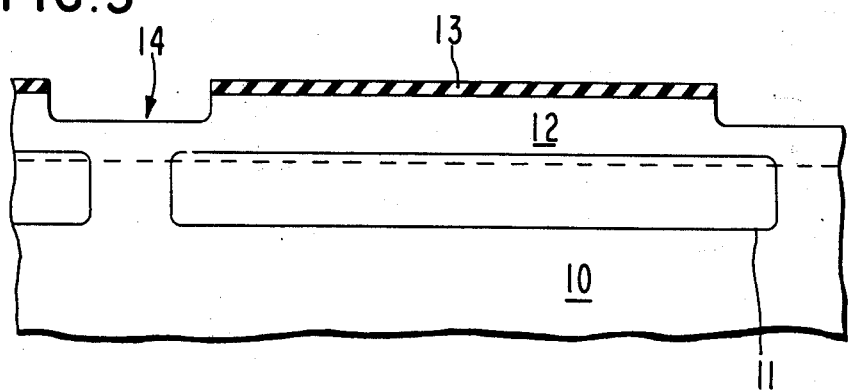
FIG. 3 is a further cross-sectional view of FIG. 2 wherein the epitaxial layer is etched to form grooves in which oxide-isolation regions will be formed.

A layer of insulating material 13, such as silicon nitride, as shown in FIG. 3, is then applied over the layer of epitaxial silicon and defined by a photomasking step to expose the areas in which oxide-isolation regions are to be formed. The phrase "oxide-isolation regions" is used to denote the silicon dioxide masses which are grown in the epitaxial silicon layer and which serve to produce electrical isolation. See U.S. Pat. No. 3,648,125 issued to D. L. Peltzer. Next, using standard etching techniques, the epitaxial layer is etched away to a depth of about 0.5 micron to produce grooves 14 in which the oxide-isolation regions will be formed.

Figure 4A:
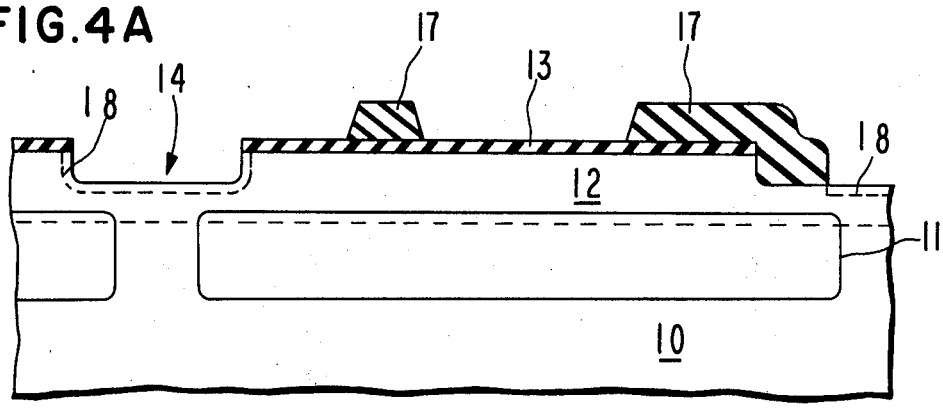
FIG. 4A is a further cross-sectional view of FIG. 3 after application of the self-aligned base insulation material and introduction of the additional impurities to form the guard ring or field implant.
Figure 4B:
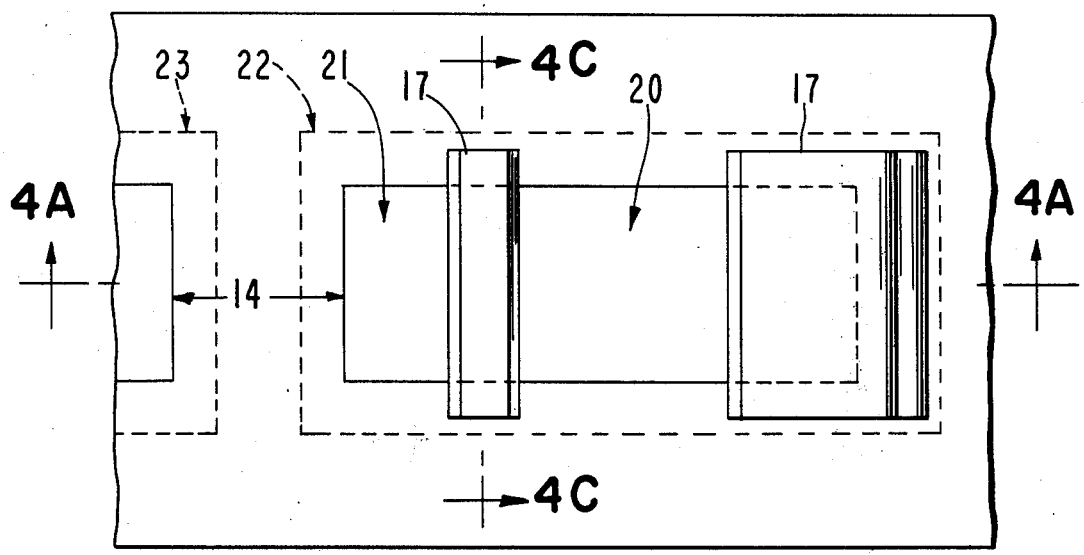
FIG. 4B is a plan view of the cross-sectional view of FIG. 4A.

A photomasking step is then employed to selectively apply self-aligned base insulating material 17 such as chemically deposited silicon dioxide, to the insulating layer 13. Self-aligned base insulating material 17 lies on two sides of the base region of the vertical transistor to be formed. It serves to separate the base region of the vertical transistor to be formed from the emitter/injector of the lateral transistor to be formed and covers the collector contact for the vertical transistor to be formed. Self-aligned base insulating material 17 forms a self-aligned base mask whose coverage is shown clearly in FIG. 4B. Since this mask defines the width of the base of the vertical transistor, transistors of varying base width can be fabricated on the same die by varying the configuration of this mask. Thus, if discrete devices are to be fabricated along with the merged injection-logic structure, parameters such as breakdown voltage and beta can be tailored and transistors with different properties can be fabricated simultaneously. The device areas are those ecompassed by grooves 14.

Figure 4C:
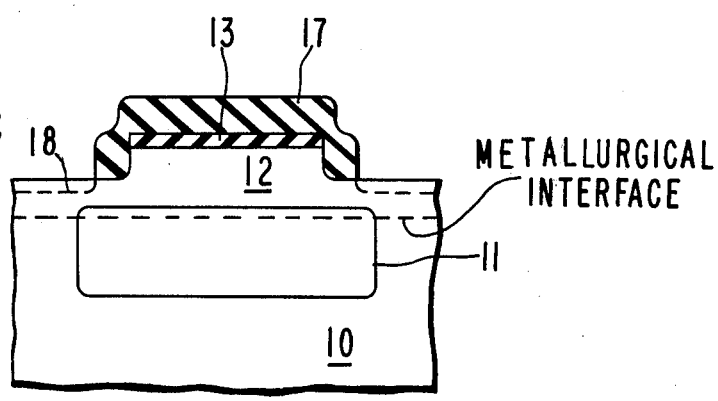
FIG. 4C is a sectional view taken from FIG. 4B as indicated and illustrates the relationship of the self-aligned base insulation material to the underlying structure.

As shown in FIG. 4C, a self-aligned base insulating material 17 covers those portions of the intersection of insulating material 13 and grooves 14 which lie between regions 20 and 21. Thus, subsequently, when impurities are applied to the exposed areas of grooves 14 to form a guard ring, they are introduced only adjacent region 20 and region 21 and not adjacent the region between them. The impurities will be of the same conductivity type as the base of the vertical NPN and will be of opposite conductivity type to the epitaxial layer, e.g. the impurities will be p-type, to prevent emitter-to-collector inversion along the wall of the base of the vertical NPN. These impurities are then deposited by a standard diffusion step to a shallow depth in the contours of the exposed area of groove 14, as shown by dotted line 18 in FIGS. 4A and 4C. Next, the isolation oxide is formed by thermal treatment or by the application of an oxidizing agent, and the impurities proceed ahead of the oxide to form a guard ring as the oxide grows into the epitaxial layer of silicon. Since no impurities were introduced to the oxide wall underneath self-aligned base insulating material 17, no guard ring is formed between the PNP emitter and the NPN base. Also, no guard ring is formed adjacent the collector contact of the vertical NPN so that no spurious p-n junction is formed. As discussed above, the guard ring serves (1) to inhibit inversion of the p-type substrate between the buried collector regions of adjacent devices (see dotted line 32 of FIG. 5A), (2) to inhibit inversion between inverse collector regions 37a or 37b (shown in FIG. 7) and the inverse emitter region formed by buried layer 11, (3) to provide preliminary doping for the emitter/injector region 35 of FIG. 6, and (4) to allow, if desired, electrical contact to the substrate from the surface of the epitaxial layer. In addition, in walled emitter devices the guard ring provides an effective low resistance path in the base of the NPN (see dotted line 33 in FIG. 5B) and minimizes debiasing effects which would otherwise lead to lower switching speeds and lesser fan-outs in injection-logic structures; without the guard ring this resistance could have a value of several tens of kilohms for walled structures. It can readily be seen that each oxide-isolation region 31 lies between two distinct structures such as structures 23 and 22, each of which is formed on its own silicon island. In this embodiment, structure 23 will become a merged injection-logic gate, but in other embodiments, described subsequently, this structure may be one of a variety of discrete devices. From the plan view of FIG. 5B, it is evident that as the oxide grows to form the oxide-isolation regions, it extends sideways as well as downwardly so that the device regions 20 and 21 of structure 22 are somewhat diminished in size. Also, the p-type impurities of the guard ring have proceeded ahead of the oxide laterally as well as downwardly so that the guard ring extends into the device region 20 as shown by dotted line 33 in FIG. 5B and 5C and into device region 21 as shown by dotted line 30 in FIG. 5A.

Using a standard photomasking step and ion-implantation, the emitter/injector region 35 of the lateral PNP is provided as shown in FIG. 6. The concentration of the p-type impurities implanted in the injector region 35 adds to the p-type impurities of the guard ring so that the injector region 35 generally has a peak concentration of $5 \times 10^{18}$ atoms/cm$^2$ at the top surface with a relatively constant concentration of $1 \times 10^{18}$ atoms/cm$^2$ around its sides. At the same time, the base region 36 of the vertical NPN is produced between the two areas of self-aligned base insulating material 17. Next, the layer of silicon nitride insulation material 13 is defined so that inverse collector regions 37a and 37b may be formed by standard diffusion or implantation techniques. These inverse collector regions will have a peak n-type concentration on the order of $5 \times 10^{19}$ atoms/cm$^2$. An n-type collector contact 38 for the buried layer collector 11 can be formed in the same step. The silicon nitride 13 which remains over the injector region 35 prevents any alteration of that region. Next, contact openings are made by a photomasking step to injector region 35 and base region 36. At that point, an additional dosage of p-type impurities can be added to produce a heavily doped injector region 35 and a satisfactory base contact 40. This step is accomplished by utilizing the photoresist layer as a barrier to the implant and thus implanting the emitter/injector and the base contact region without adding to the p-type concentration in the base of the vertical NPN. Thus, this important step is achieved without an additional masking step.

As described above, the beta of the lateral PNP will be increased by the additional dose of p-type material to the emitter/injector. The base contact implant improves the beta of the vertical NPN operating in the inverse mode since there is no increase of the impurity concentration in the intrinsic base region, i.e., in the area underlying the inverse collectors, but only in the contact region so that the recombination current at that contact is minimized. The depth 41 of base region 36 is increased underneath the location of the base contact 40 but no harm is done to the vertical NPN parameters so long as buried collector region 11 is not contacted. The structure is then completed by the application of suitable conductive contacts.

The process used to fabricate the oxide-isolated merged injection-logic gate structure as described above can be generalized to a standard Isoplanar process sequence which can be used to fabricate a large number of discrete devices as well. This standard sequence includes the following steps for a p-substrate (for an n-substrate starting material, the conductivity types of the respective dopants would be reversed in each successive step):

1. Oxidize the p-substrate.
2. Mask to define the buried collector regions (inverse emitters in the injection-logic sequence) and isolation regions; diffuse-n-type impurities in the buried collector regions and crossunders.
3. Strip the oxide by etching and then grow n-type epitaxial silicon layers with a thickness on the order of 1 micron.
4. Deposit a layer of silicon nitride.
5. Mask to define the oxide-isolation regions and etch grooves to a depth of about .5 micron.
6. Vapor-deposit layers of silicon dioxide to produce selfaligned base mask over boundary of base of lateral PNP and oxide-isolation region and over boundary of collector contact of vertical NPN and oxide-isolation region.
7. Diffuse p-type impurities in exposed grooves.
8. Form oxide-isolation regions in grooves and diffuse guard ring ahead of oxide growth.
9. Ion-implant p-type impurities into all epitaxial silicon regions not covered with vapor-deposited oxide or isolation oxide to form emitter and collector of PNP and base of NPN.
10. Mask to define inverse collector and buried layer contact of vertical transistors.
11. Diffuse n-type impurities into the inverse collectors and buried layer contact of vertical transistors.
12. Mask to expose the emitter/injector of the lateral transistor and the base contact regions and ion-implant p-type impurities into these regions.
13. Deposit metal to form the interconnect layer, mask and define the interconnect layer.

As can be seen, the standard process sequence takes a total of six masking steps, viz., steps 2, 5, 6, 10, 12 and 13.

The standard process sequence set forth in the preceding paragraph may be employed to produce a variety of devices without the addition of specific process steps. The primary devices are catalogued below:

1. Vertical NPN transistors in walled and non-walled format.
2. Lateral PNP transistors in walled and non/walled format.
3. Merged transistor logic cells.
4. Vertical PNP transistors with a substrate contact.
5. Vertical PNP transistors in low $\beta$ version.
6. p-type resistors in walled or non-walled format.
7. Buried layer resistors.
8. Epitaxial resistors.
9. Pinched-base resistors.
10. p-channel field-effect transistors.
11. Pinched epitaxial resistors.
12. Epitaxial field-effect transistors.
13. Schottky devices providing an additional masking step is added to define the metal contact.

Figure 5A:
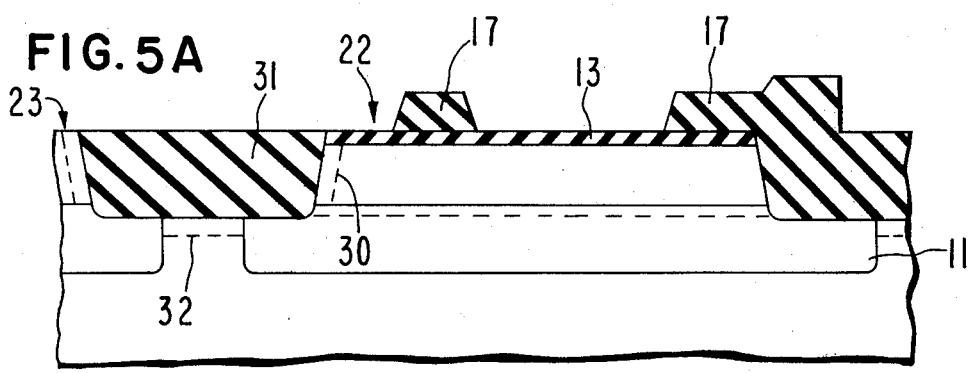
FIG. 5A is a further view of the cross-section of FIG. 4A after the thermal growth of the oxide-isolation regions in the etched grooves and outward migration of the additional impurities to form a guard ring.
Figure 5B:
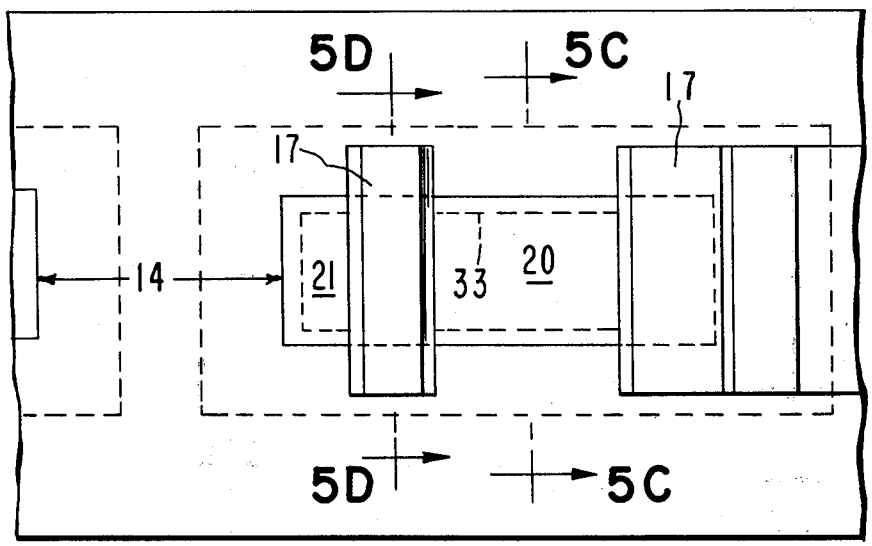
FIG. 5B is a plan view of the cross-section of FIG. 5A.
Figure 5C:
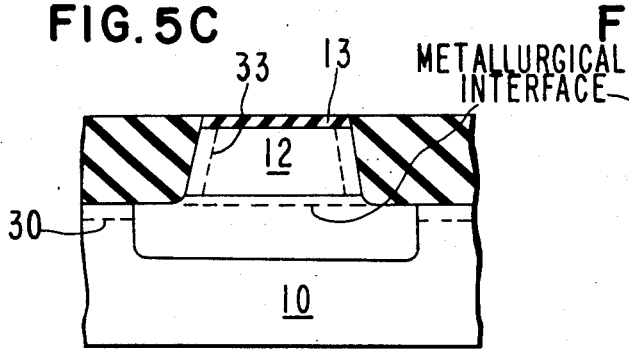
FIG.5C is a sectional view taken from FIG. 5B as indicated.
Figure 5D:
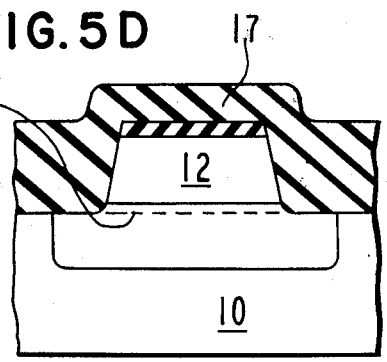
FIG. 5D is a sectional view taken from FIG. 5B as indicated.
Figure 11:
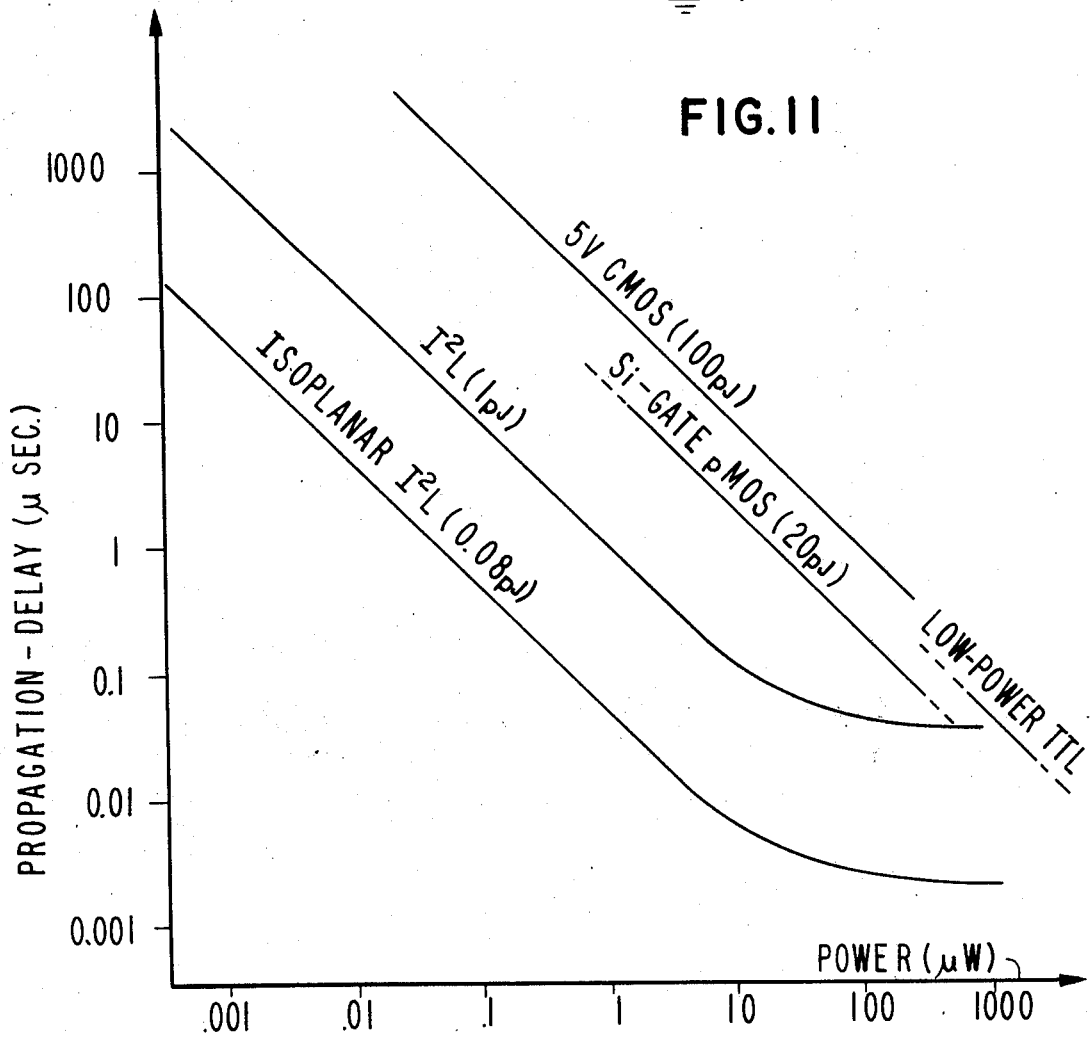
FIG. 11 is a graph showing the propagation-delay power relationship for devices fabricated with various technologies including Isoplanar injection-logic devices.
Figure 13:
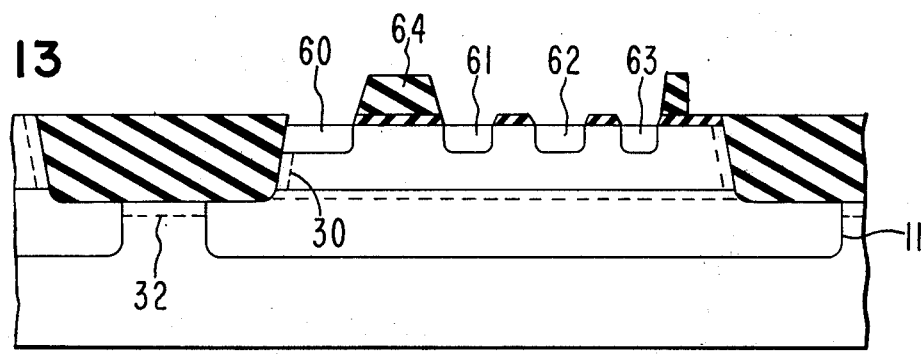
FIG. 13 is a cross-sectional view of an intermediate process step for a modified standard process taken generally from FIG. 4A after the silicon nitride layer has been selectively etched and injector, base and base contat regions have been formed.
Figure 14:
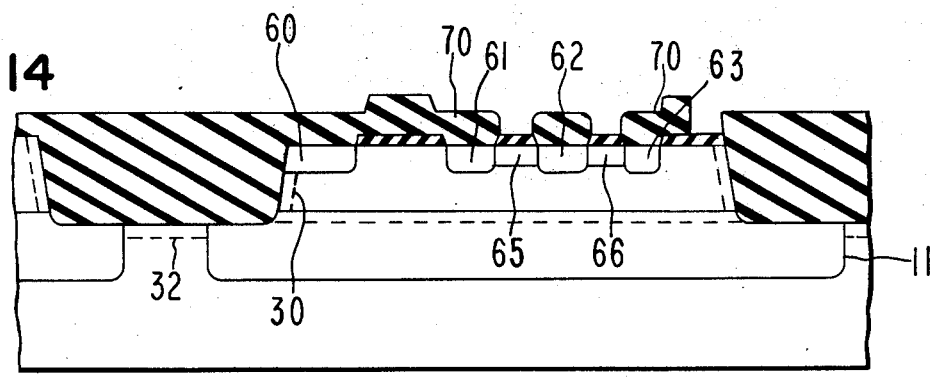
FIG. 14 is a cross-sectional view of FIG. 13 after selective growth of a silicon dioxide layer on the area not covered by silicon nitride and implantation of lightly doped regions between segments of the base region and the base contact region.
Figure 15:
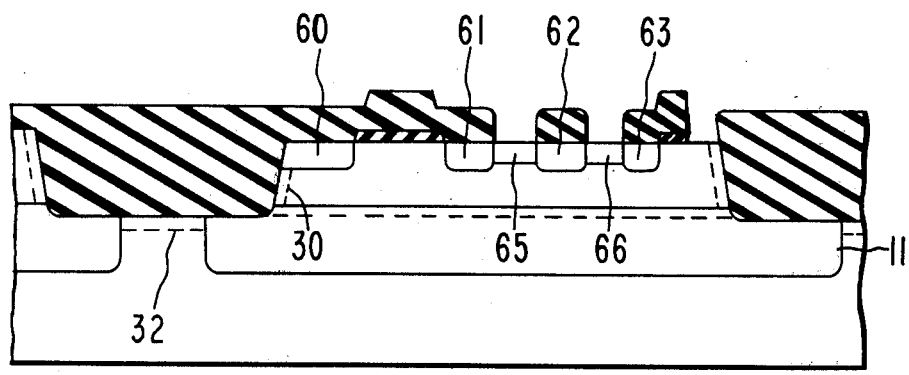
FIG. 15 is a further view of FIG. 14 after selective removal of the silicon nitride layer in preparation for diffusion of the inverse collector/emitter region and the inverse collector contact for the vertical bipolar device.
Figure 16:
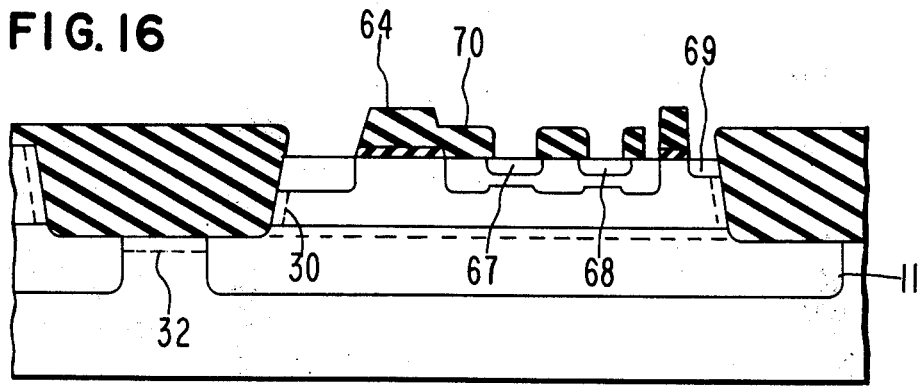
FIG. 16 is a further view of FIG. 15 after formation of the inverse collector/emitter regions, inverse collector contact and opening up of the base contact for the vertical bipolar device.

A variation of the standard process sequence set out above may be employed to produce a merged injection-logic gate which has improved speed and lower losses. The process is essentially the same through formation of the oxide-isolation regions and applications of the self-aligned base, except that the self-aligned base does not extend to the oxide-isolation region (compare FIGS. 5A and 13). After formation of the guard ring around the oxide-isolation regions as shown in FIG. 5A, the insulation layer 13 is defined as shown in FIG. 13 to permit the formation by ion-implatation or diffusion of emitter/injector region 60, base region segments 61 and 62, and base contact segment 63. For the preferred merged injection-logic structure fabricated from a lateral PNP and a vertical NPN, these regions would be diffused p-regions with a peak concentration on the order of $1 \times 10^{19}$ atoms/cm$^2$. Then, as shown in FIG. 14, a screening material 70, such as a layer of thermally grown silicon dioxide 0.5 micron thick is formed on all exposed surfaces of the epitaxial layer. Using ion-implantation a low concentration of p-type impurities with a peak concentration on the order of $5 \times 10^{17}$ atoms/cm$^2$ is implanted underneath the still-exposed nitride regions to form base segments 65 and 66. A segmented base region is thereby formed which has alternating sections of heavy p-type concentration (regions 61, 62 and 63) and light p-type concentrations (regions 65 and 66). As shown in FIG. 15, the nitride insulaion layer is selectively removed above low concentration regions 65 and 66 and above the location of the inverse emitter contact 69 to be formed so that diffused inverse collector regions 67 and 68 may be formed in the base region. At the same time, inverse emitter contact region 69 is formed as shown in FIG. 16. With the subsequent application of suitable metallization, a merged injection-logic gate structure is formed in which there is a high concentration of p-type material between adjacent inverse collectors and therefore a lower resistance. This lowers resistance even beyond the value achieved by the presence of the guard ring. Thus, debiasing under the collector is reduced at high current levels so that the speed of the injection-logic gate is improved. This means that the propagation delay-power product is lowered in the flat portion of the graph of FIG. 11. Also, the $\beta$ of a discrete lateral PNP is improved as well as the fan-out of multi-collector NPN's without requiring process steps which compromise the vertical transistor. And, the higher concentration of p-type doping in the extrinsic base region minimizes current injected into this area from the buried layer emitter so that the d.c. characteristics of the inverse $\beta$ of the vertical NPN are improved. The structure is effectively a self-aligned emitter structure which has heavy doping in the extrinsic base region and low doping in the intrinsic base region. Inherently this produces controllably high gains and diode-like structures if discrete devices are fabricated.

The processing sequence for this preferred modified standard process uses the first five steps of the standard process in identical form. After these five steps, the modified standard process includes the steps of:

6. Vapor-deposit a layer of silicon dioxide to produce a self-aligned base mask over boundary of base of lateral PNP and oxide-isolation region as well as between base contact region and inverse emitter contact region of vertical NPN.

7. Diffuse p-type impurities in exposed grooves.

8. Form isolation oxide regions and diffuse guard ring ahead of oxide growth.

9. Mask nitride regions and remove nitride except where n-type regions will be required.

10. Diffuse p-type impurities into areas not protected by nitride or isolation oxide and thermally treat to oxidize exposed epitaxial regions and to effect drive-in of the diffused impurities to form heavily doped extrinsic base segments and injection region.

11. Apply and define photoresist and ion-implant a low concentration of p-type impurities in between base segment regions to form intrinsic base segments of NPN transistors.

12. Etch nitride regions to define inverse collector regions and inverse emitter contact region for the vertical NPN and diffuse n-type impurities.

13. Mask p contact regions. Ion-implant p-type impurities into contact regions if required.

14. Deposit metal to form the interconnect layer, mask and define the interconnect layer.

It can be seen that the modified standard process requires seven masking steps: 2, 4, 6, 9, 11, 13 and 14. This modified standard process can be used to fabricate the same catalogue of thirteen devices listed above for the standard process.

Figure 9:
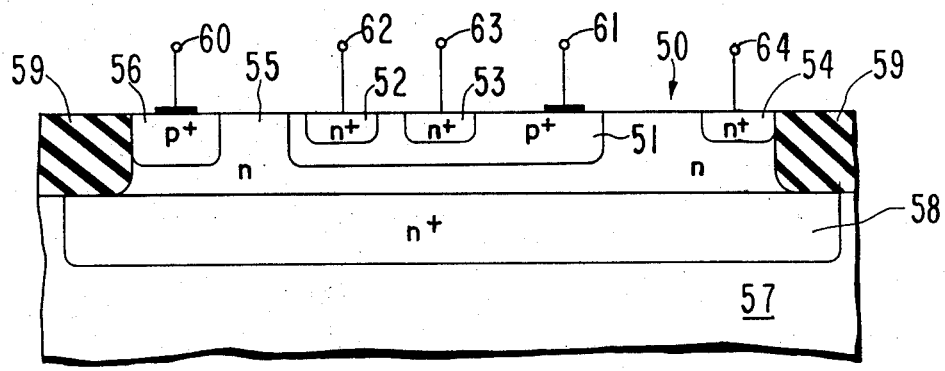
FIG. 9 is a cross-section in pictorial form of the merged injection-logic gate formed by the process of the present invention.

The merged structure of the injection-logic gate is shown in pictorial form in FIG. 9. As described above, the merged structure 50, in the preferred embodiment, comprises a vertical NPN with multiple inverse collectors 52 and 53, base 51 and emitter 58, and a complementary lateral PNP with emitter/injector 56, base 55 and collector 51. The lateral PNP serves as a current injector and load for the vertical PNP. Oxide-isolation regions 59 provide electrical isolation between adjacent structures and result in increased packing density. Sidewall capacitance between the emitter and base is also reduced as disclosed in A. Allen et al, "Oxide-Isolation Integrated Injection Logic", 1974, *ISSCC Conf. Reports*, pp. 16 et seq. The merged structure 50 of the present invention has a guard ring along the interface between oxide wall 59 and base region 51 where they come in contact (not shown in FIG. 9 but akin to the showing in FIGS. 4B and 5B). This guard ring allows the inverse collectors 52 and 53 to extend from one oxide-isolation region to another, i.e., allows the walled emitter format, without emitter-to-collector inversion along the interface between the base and the adjacent oxide-isolation region. The presence of the guard ring also enhances lateral conduction in the collector 51 of the PNP, a feature which is especially desirable if the contact to region 51 is placed on the side of inverse collectors 52 and 53 opposite emitter 56 so that the current would have to pass through the constricted passageway underneath the inverse collectors. The guard ring is especially useful for achieving high fan-out since a high resistance would reduce the speed of the last collector in a circuit.

Figure 10:
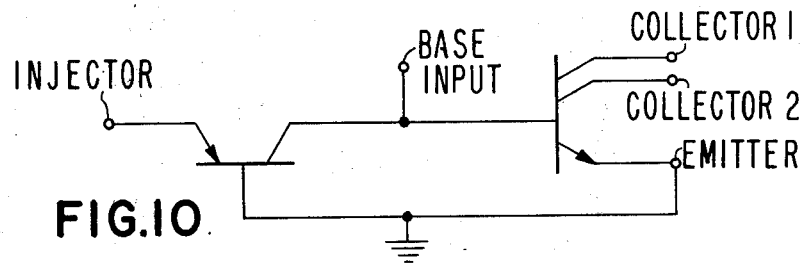
FIG. 10 is a logic diagram for the injection-logic gate of FIG. 9.

The logic diagram of the injection-logic gate of the composite structure of FIG. 9 is shown in FIG. 10. Merged structure 50 of FIG. 9 will function as an injection-logic gate if terminal 60 is the injector, terminal 61 is the base input, terminals 62 and 63 are the collector contacts and terminal 64 is the emitter contact. In an optimal injection-logic device, such as the structure of the present invention, the emitter of the vertical transistor is close to the base to minimize current loss; this is accomplished without emitter-to-collector inversion by the selective use of a guard ring as described above. The walled emitter format further allows a high inversion emitter-to-base area ratio which allows optimization of the inverse $\beta$s to also be achieved. This optimization and the high betas for the constituent devices due to the heavy doping in the injector/emitter of the lateral device and the heavy doping in the base contact of the vertical device results in the low propagation delay versus power relationship shown in FIG. 11.

What is claimed is:

1. In a process for fabricating in a semiconductor body an injection logic semiconductor device having a vertical bipolar transistor and a lateral bipolar transistor formed in a device region in said semiconductor body and a guard ring for selective portions of said region, the steps of defining the device region and a self-aligned base region for the lateral bipolar transistor comprising:
    growing a doped epitaxial layer of one conductivity type on a semiconductor substrate;
    applying an insulation material over said epitaxial layer;
    selectively removing said insulation material and a portion of the underlying epitaxial layer, thereby forming a groove and defining said device region;
    applying additional insulation material over a portion of said device region and adjacent portions of said groove, thereby defining the base region of said lateral bipolar transistor;
    applying an impurity of opposite conductivity type to exposed portions of said groove to selectively form a guard ring; and
    forming an oxide of said semiconductor in said groove to form oxide isolation for said device region.

2. The process as recited in claim 1 and includng before the step of growing a doped epitaxial layer the step of
    forming a buried layer region of said one conductivity type in said semiconductor substrate.

3. A process for fabricating an injection logic semiconductor device in a device region of a semiconductor substrate, said injection logic semiconductor device including an inverted vertical bipolar transistor having a surface oriented inverted collector, a base, and an emitter, and a lateral bipolar transistor having an emitter, a base and a collector, the base region of said vertical transistor and said collector of said lateral transistor comprising the same region, comprising the steps of
    growing a doped epitaxial layer of one conductivity type on a semiconductor substrate;
    forming a groove in said epitaxial layer, said groove surrounding and defining said device region;

forming a self-aligned base insulation material over a portion of said device region and adjacent portions of said groove;

selectively applying an impurity of opposite conductivity type to the exposed portions of said groove to thereby selectively form a guard ring;

forming an oxide of said semiconductor in said groove to form oxide insulation for said device region;

diffusing impurities of said opposite conductivity type into said epitaxial layer on either side of said self-aligned base insulation material and within said device region thereby defining the emitter of said lateral bipolar transistor and the base region of said vertical bipolar transistor; and selectively diffusing impurities of said one conductivity type within said base region of said vertical bipolar transistor thereby defining said inverted collector region of said vertical bipolar transistor.

4. The process as defined by claim 3 wherein the step of applying the self-aligned base insulation material further includes applying additional insulaion material over another portion of said device region for defining a contact area to said emitter of said vertical bipolar transistor.

5. The method defined by claim 4 and further includng the steps of selectively removing a portion of said additional insulation material and diffusing impurities of said one conductivity type into the exposed epitaxial layer concurrently with formation of said inverted collector region of said vertical bipolar transistor, thereby forming a highly doped contact region to said emitter region of said vertical bipolar transistor.

6. The process as defined by claim 5 and further including the step of forming a contact on said epitaxial layer surface to said base region of said vertical bipolar transistor.

7. The process as defined by claim 6 wherein said step of forming a base contact includes exposing a surface portion of said base region and applying dopant of opposite conductivity type to said exposed portion of said base region thereby increasing the impurity concentration of said base region for said contact.

8. The process as defined by claim 7 wherein said dopant of opposite conductivity type is applied to said emitter region of said lateral bipolar transistor concurrently with the diffusion of impurities into said base region of said vertical bipolar transistor.

* * * * *